(12) United States Patent
Glenn

(10) Patent No.: US 6,441,485 B1
(45) Date of Patent: Aug. 27, 2002

(54) APPARATUS FOR ELECTRICALLY MOUNTING AN ELECTRONIC DEVICE TO A SUBSTRATE WITHOUT SOLDERING

(75) Inventor: Thomas P. Glenn, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/569,716

(22) Filed: May 11, 2000

(51) Int. Cl.[7] ............................................. H01L 23/34
(52) U.S. Cl. ........................ 257/727; 361/783; 361/719; 361/809
(58) Field of Search ................................ 361/801, 807, 361/809, 810, 703, 717, 718, 719, 759, 803, 783; 206/710; 257/678, 727, 726

(56) References Cited

U.S. PATENT DOCUMENTS

| | | | | |
|---|---|---|---|---|
| 5,452,181 A | * | 9/1995 | Hoover | 361/697 |
| 5,493,237 A | * | 2/1996 | Volz et al. | 324/754 |
| 5,570,273 A | * | 10/1996 | Siegel et al. | 361/773 |
| 6,222,731 B1 | * | 4/2001 | Katsui | 361/697 |

* cited by examiner

Primary Examiner—Kamand Cuneo
Assistant Examiner—José H. Alcala
(74) Attorney, Agent, or Firm—Skjerven Morrill LLP; James E. Parsons

(57) ABSTRACT

An apparatus for mounting an electronic device on a substrate without soldering is disclosed. The apparatus includes a body and a plurality of cantilever beams extending from the body. The apparatus is mounted on the substrate. The electronic device is placed within the apparatus. In one embodiment, the cantilever beams press against the electronic device. In another embodiment, the cantilever beams engage the substrate. The apparatus presses an array of electrical contacts of the electronic device (e.g., interconnection balls) against corresponding metal pads of the substrate, thereby forming an electrical connection.

15 Claims, 3 Drawing Sheets

APPARATUS FOR ELECTRICALLY MOUNTING AN ELECTRONIC DEVICE TO A SUBSTRATE WITHOUT SOLDERING

BACKGROUND OF THE INVENTION

An electronic device is sometimes mounted to a substrate using an array of interconnection balls. The interconnection balls are usually formed of tin lead solder.

One such electronic device is a ball grid array (BGA) package. A BGA package typically includes a substrate having an upper side and a lower side. An integrated circuit is mounted on the upper side of the substrate. Encapsulant covers the integrated circuit chip and the upper side of the substrate. Bond wires electrically connect the integrated circuit to the substrate. Solder interconnection balls are fused to the second side of the substrate. The BGA package is mounted on a printed circuit board (PCB) or other substrate by reflowing the interconnection balls so that the interconnection balls become fused to metallizations of the PCB, thereby forming an electrical connection between the BGA package and the PCB.

Another type of electronic device that uses interconnection balls is known as a "flip chip". A flip chip is an integrated circuit having bond pads on a side thereof. Solder interconnection balls are electrically connected to the bond pads. The flip chip is mounted on a PCB by fusing the interconnection balls to metallizations of the PCB, thereby forming an electrical connection between the flip chip and the PCB. An insulative adhesive underfill material is provided beneath the flip chip to help secure the flip chip to the PCB.

With both the BGA package and the flip chip, the physical and electrical connection to the PCB is accomplished by heating and reflowing the interconnection balls. Such a soldered connection is time consuming and expensive to make, and difficult to take apart. Flip chips also require underfill, which adds to manufacturing time and cost.

SUMMARY OF THE INVENTION

The present invention includes an apparatus for mounting an electronic device that has an array of interconnection balls (e.g., a BGA package or a flip chip) or other electrically conductive contacts (e.g., a leadless chip carrier package) on a substrate such as a PCB. Neither soldering nor underfill is required.

One embodiment of a socket within the present invention includes a hollow rectangular frame and one or more cantilever beams extending from the frame. The socket is located on and fixed to the substrate (e.g., a PCB). The electronic device is inserted into the socket past the cantilever beams. The cantilever beams apply a continuous downward pressure on the top of the electronic device. This pressure presses the interconnection balls or other contacts on the opposite lower side of the electronic device against corresponding metal pads on the substrate, thereby forming an electrical connection without soldering between the electronic device and the substrate.

Another embodiment of a socket within the present invention includes a body having cantilever beams extending from one side thereof. The body may be a hollow frame or a solid plate. The electronic device is seated in the socket against the body and within the beams. The socket is attached to the substrate by inserting the cantilever beams into corresponding apertures of the substrate. The beams pull the body toward the substrate. Since the electronic device is between the body and the substrate, the body in turn presses the electronic device and its interconnection balls against the substrate. The continuous downward force exerted on the device by the socket ensures a reliable electrical connection between the electronic device and the substrate without soldering.

Further features and advantages of the invention will appear from the detailed description given below and the accompanying drawings.

DETAILED DESCRIPTION

Figure 1:
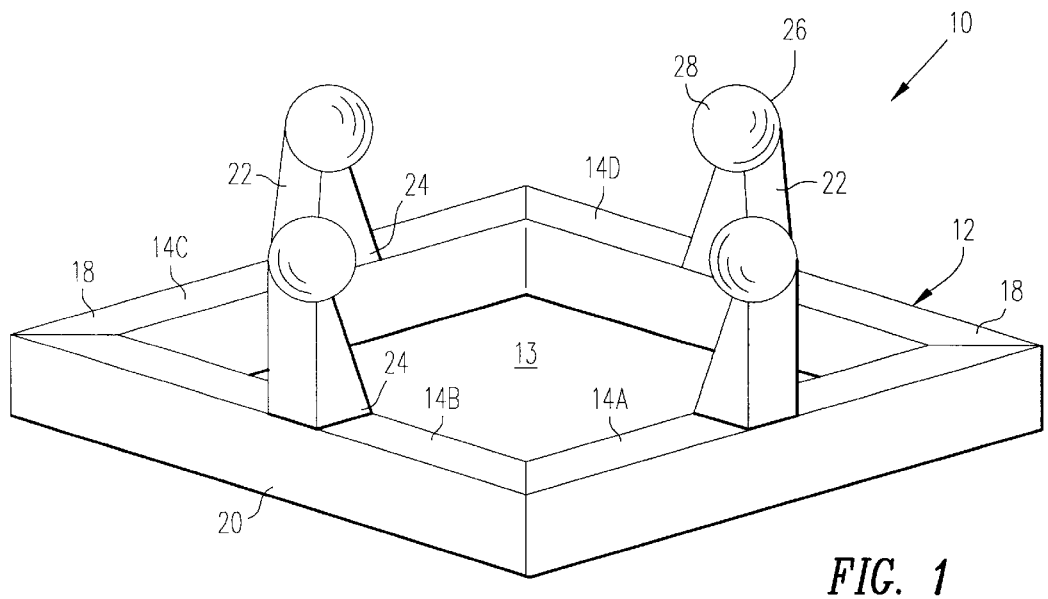
FIG. 1 is a perspective view of an apparatus for mounting an electronic device on a substrate.

FIG. 1 shows an embodiment of a mounting apparatus, denoted as socket 10, within the present invention. In this embodiment, socket 10 is a one piece structure, but that may vary. Socket 10 may be formed of plastic, such as injection molded plastic, metal, or other materials.

Socket 10 includes a hollow rectangular frame 12 formed by four intersecting rectilinear members 14A, 14B, 14C, and 14D. Members 14A–14D define a central aperture 13. Frame 12 has a size and shape that allows an electronic device to snugly fit within central aperture 13.

Members 14A–14D of frame 12 have an upper first side 18 and an opposite lower second side 20. Four cantilever beams 22 extend vertically from first side 18 of frame 12. In particular, one beam 22 extends from each member 14A–14D of frame 12. Each beam 22 has a rectangular cross-section and is tapered along its length. A first end 24 with the larger cross-section is integrally connected to first side 18 of frame 12. An opposite free end 26 of each beam 22 is distal from frame 12. A ball 28 is formed at free end 26 of each beam 22. Each beam 22 is inclined so as to extend inward over central aperture 13 of frame 12. Ball 28 of free end 26 of each beam 22 superimposes aperture 13.

Although socket 10 has four beams 22 in this embodiment, the number of beams 22 may vary (e.g., there may be two beams 22). Further, whereas beams 22 are shown as extending from first side 18, the location of their attachment to frame 12 may vary. For example, beams 22 may extend upward from the outer peripheral sides of frame 12. In addition, although a ball 28 is formed at free end 26 of each beam 28, a ball shape is not mandatory. Some other shape that allows an electronic device to be insert past the opening defined by free ends 26 and into central aperture 13 may be used.

Figure 2:
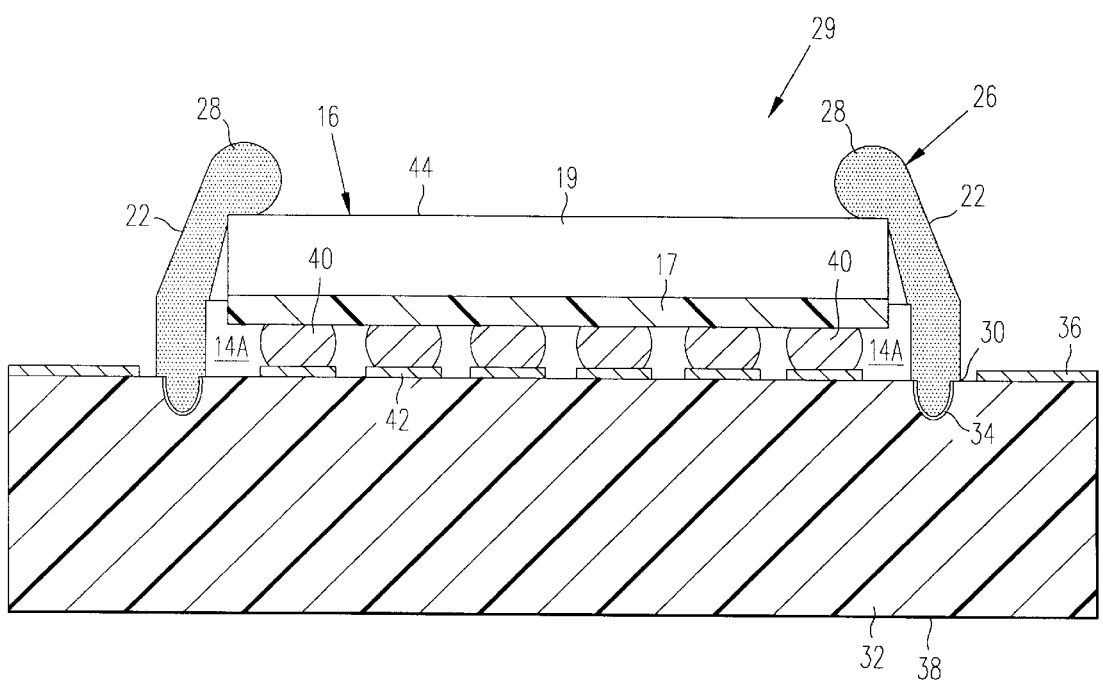
FIG. 2 is a cross-sectional side view of a mounting that includes the apparatus of FIG. 1 and a BGA package inserted within the apparatus.

FIG. 2 shows a mounting 29 that includes socket 10 of FIG. 1. Socket 10 is mounted on a substrate 32 which in this example is a PCB. An electronic device 16 having an array of interconnection balls 40 is mounted on substrate 32 within socket 10. Socket 10 physically and electrically connects electronic device 16 to substrate 32.

In this embodiment, electronic device 16 is a BGA package, but electronic device 16 also may be a flip chip or some other electronic device. Electronic device 16 includes a substrate 17 to which interconnection balls 40 are electrically connected, and a molded body 19.

Interconnection balls 40 may be formed of solid metal, such as eutectic tin lead solder or 90-10 tin lead solder. Solder balls may cold flow over time, thus requiring a constant downward pressure (like that applied by the socket) to maintain good electrical contact.

Alternatively, interconnection balls 40 may be made of other materials. For example, interconnection balls 40 may be formed of: a metal-coated plastic material (e.g., a nickel and gold coating on an insulative plastic ball); an electrically conductive, metal-filled epoxy or other plastic material; an electrically conductive, metal-filled silicone material; an electrically conductive, metal-filled compliant material; or an electrically conductive, metal-filled organic material. Alternatively, instead of having interconnection balls 40, electronic device 16 may have other types of electrically conductive contacts formed of the same materials, such an array of interconnection pads, as in a leadless chip carrier package.

Referring to FIG. 2, second side 20 of each member 14A–14D of frame 12 has a protrusion 30 extending vertically downward into substrate 32. Protrusion 30 is an oval-shaped dimple in this embodiment. The size, shape, and location of each protrusion 30 is variable and is complementary to the size, shape, and location of a slot 34 in upper surface 36 of substrate 32. The complementary shapes of each protrusion 30 and slot 34 allows protrusion 30 to be snapped into slot 34, thereby precisely fixing socket 10 to substrate 32. A precise location of socket 10 on substrate 32 ensures that each interconnection ball 40 of electronic device 16 will be superimposed over a corresponding metal pad 42 of substrate 32, thereby forming correct and reliable electrical connections between electronic device 16 and substrate 32. For additional connective strength and dimensional stability over a period of time, an adhesive material such as epoxy may be applied between the juxtaposed surfaces of socket 10 and substrate 32. In an alternative embodiment, protrusions 30 and slots 34 are omitted, and an adhesive is used to secure the socket to the substrate. Care must be taken, however, to ensure a precise location of the socket on the substrate.

Once socket 10 has been mounted on substrate 32, electronic device 16 is inserted into socket 10. In particular, electronic device 16 is pushed downward toward substrate 32 through the opening defined by balls 28 of beams 22. Once device 16 is forced past balls 28, device 16 continues downward until coming to rest on substrate 32 within aperture 13 of frame 12. The precise dimensions of aperture 13 and the precise location of socket 10 on substrate 32 results in balls 40 superimposing and contacting corresponding pads 42 on substrate 32. The length and inclination angle of beams 22 is such that the lower portion of each ball 28 contacts and applies a continuous downward force on the upper side 44 of body 19 of electronic device 16. The continuous downward pressure applied by beams 22 on device 16 presses interconnection balls 40 firmly against pads 42 of substrate 32, thereby forming an electrical connection between electronic device 16 and substrate 32. Beams 22 of socket 10 firmly lock electronic device 16 to substrate 32.

A feature of the present invention lies in the fact that the electrical connection between interconnection balls 40 and pads 42 is made without soldering, and therefore the connection can be broken with relative ease. Device 16 may be removed from substrate 32 and socket 10 by pushing beams 22 laterally outward so that beams 22 no longer superimpose or contact device 16, and then lifting or prying device 16 off substrate 32 and out of socket 10. A simple symmetrical tool formed of spring steel or the like may be constructed to simultaneously force each beam 22 laterally outward, after which device 16 can be pried upwards using a slender implement.

Figure 3:
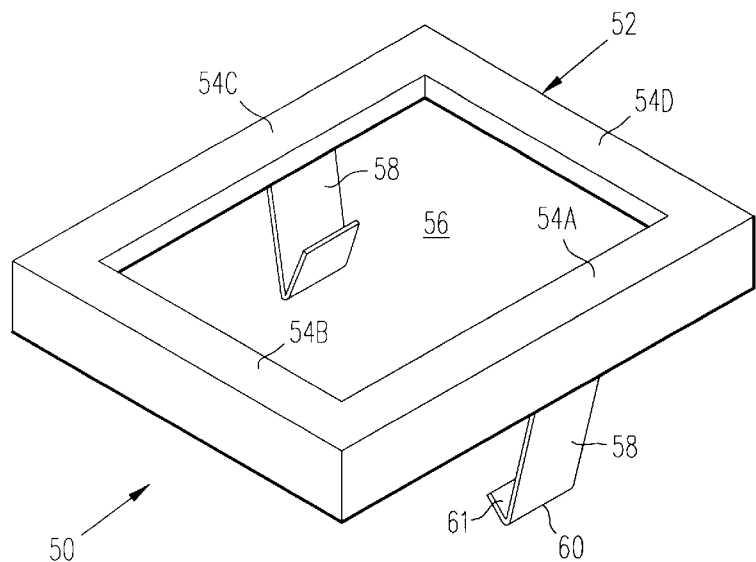
FIG. 3 is a perspective view of another embodiment of an apparatus for mounting an electronic device on a substrate.

FIG. 3 shows another embodiment of a mounting apparatus, denoted as clamp 50, within the present invention. Clamp 50 is a one-piece structure and includes a hollow rectangular frame 52. Frame 52 is formed by four interconnected rectilinear members 54A, 54B, 54C and 54D.

Two cantilever beams 58 extend vertically downward from frame 52. One beam 58 extends from member 54A and the other extends from parallel opposing member 54C. In alternative embodiments, the number of beams 58 may vary. For example, there may be four beams 58, one extending from each member 54A–54D.

Members 54A–54D and cantilever beams 58 define a hollow middle section 56. Beams 58 are at an oblique angle to frame 52 and extend inwardly over hollow middle section 56 of frame 32. Free end 60 of each cantilever beam 58 includes a tab 61 that is bent upwardly and inwardly at an oblique angle to beam 58.

Figure 4:
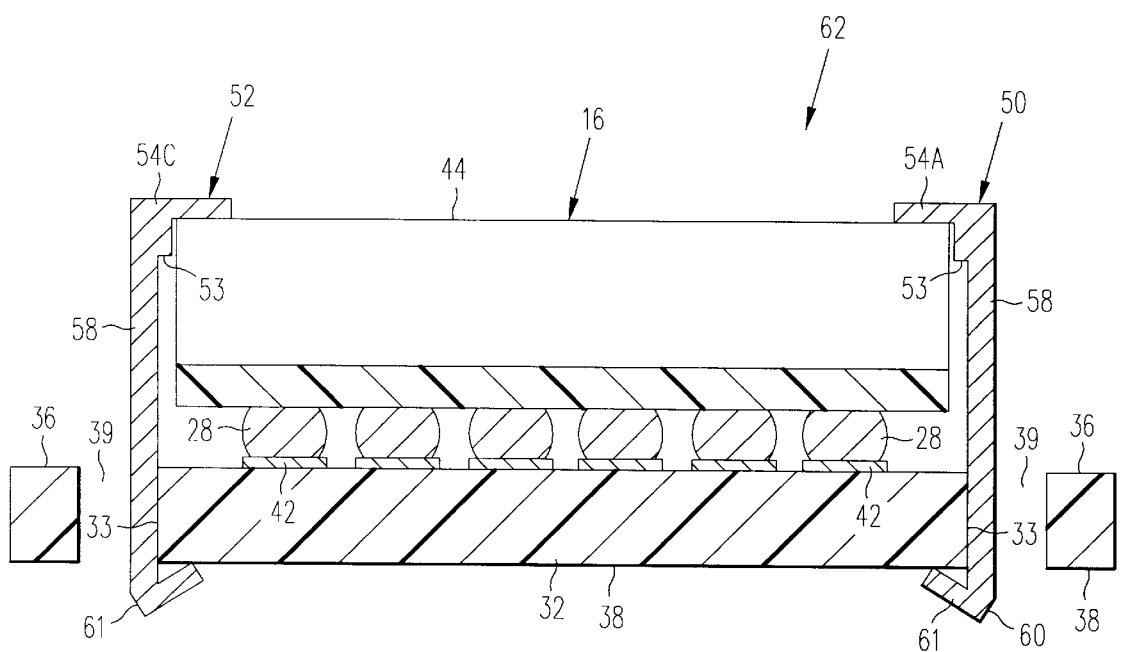
FIG. 4 is a cross-sectional side view of a mounting that includes the apparatus of FIG. 3 and a BGA package inserted within the apparatus.

FIG. 4 shows a mounting 62 that includes an electronic device 16 mounted on substrate 32 within clamp 50. Clamp 50 is holding and pressing electronic device 16 (e.g., a BGA package) against top surface 36 of substrate 32. Balls 40 on the lower side of electronic device 16 superimpose and are pressed against metal pads 42 of substrate 32, thereby forming an electrical connection. The underside of each member 54A–54D includes a 90° recess 53 within which electronic device 16 is seated in an immovable manner. A horizontal portion of each member 54A–54d rests on and extends over a peripheral portion of top surface 44 of body 19 of electronic device 16.

Beams 58 pull frame 52 towards substrate 32, and thereby secure clamp 50 and electronic device 16 to substrate 32. Each beam 58 extends through a precisely sized and located aperture 39 in substrate 32. The end of each tab 61 contacts the lower surface 38 of substrate 32. The correspondence between the location and size of each aperture 39 and the respective beam 58 precisely aligns balls 40 of electronic device 16 on the appropriate respective pads 42 of substrate 32.

In this embodiment, clamp 50 is made of a material that has a suitable modulus of elasticity for providing appropriate spring force to hold clamp 50 to substrate 32. Clamp 50 is formed so that when beams 58 are inserted through apertures 39, beams 58 apply a continuous inward force against inner sidewall 33 of aperture 39. In addition, tabs 61 are formed so as to apply a continuous upward force against lower surface 38 of substrate 32, thereby pulling frame 52 toward upper surface 36 of substrate 32. Clamp 50 may be formed, for example, of spring steel, other springy metals, or plastic, such as an injection molded plastic material.

Figure 5:
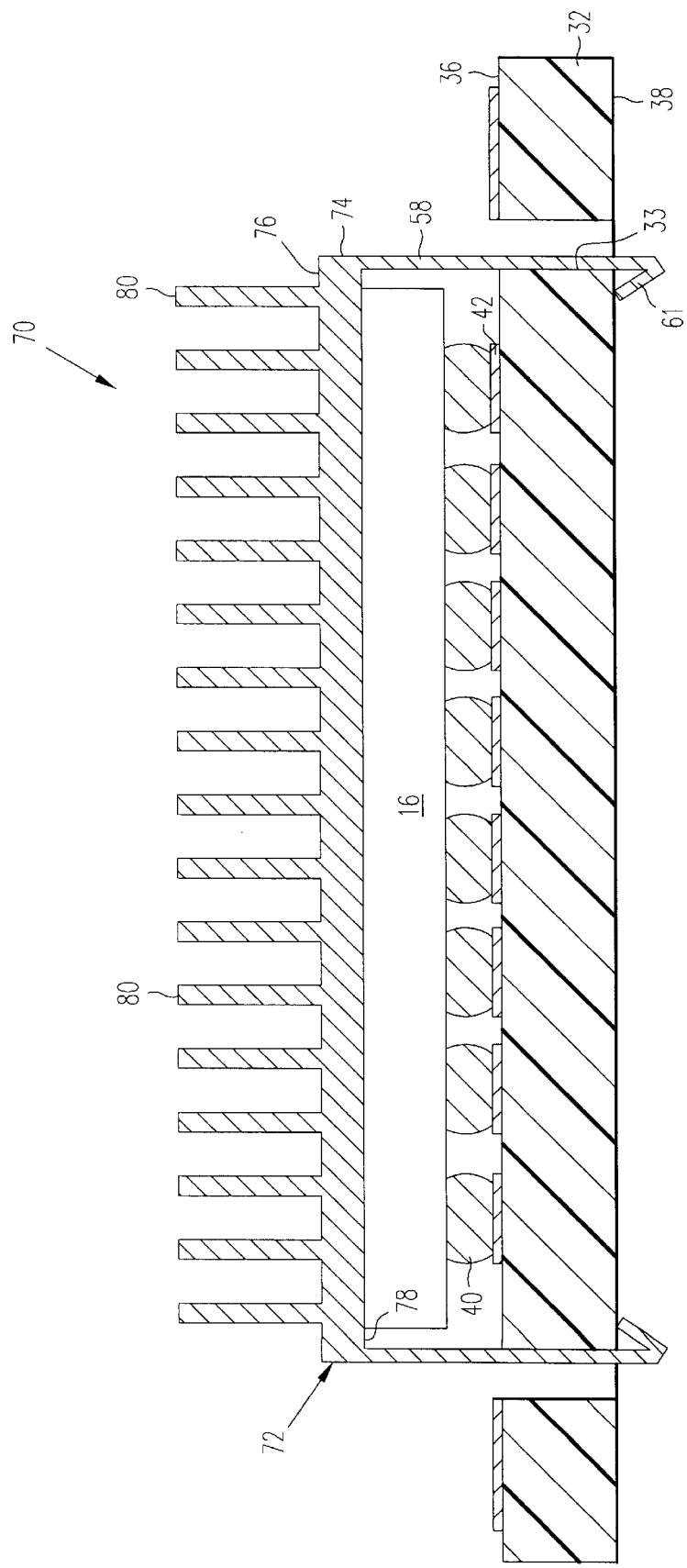
FIG. 5 shows a cross-sectional side view of a mounting that includes an apparatus having heat radiation fins.

FIG. 5 shows another embodiment of a mounting 70 within the present invention. Mounting 70 includes a mounting apparatus, denoted clamp 72 that is similar to clamp 50 of FIG. 3, and has numerous common features. Accordingly, only the differences will be discussed.

The body of clamp 72 of FIG. 5 includes a rectangular plate 74, rather than a hollow frame like clamp 50 of FIG. 3. Clamp 72 may be formed of metal, such as steel, aluminum, or copper. Plate 74 has a upper side 76 and a lower side 78. A plurality of optional metal cooling fins 80 extend vertically upward from upper side 76 of plate 74. Since electronic device 16 is in physical contact with lower side 78 of plate 74, heat is conducted through plate 74 to cooling fins 80, thereby cooling electronic device 16. Cantilever beams 58 extend vertically downward from the periphery of plate 74. A tab 61 is at the free end of each cantilever beam 58. Plate 74 includes a rectangular recess in its lower side 78 in which electronic device 16 is snugly seated. Enclosing electronic device 16 in the recess helps to keep balls 40 on the appropriate pads 42.

To form mounting 70, electronic device 16 may be placed in the recess of lower side 78 of plate 74. Cantilever beams 58 of clamp 72 are then passed through apertures 39, and interconnection balls 20 are placed on the corresponding pads 42 of substrate 32. Tabs 61 on ends 60 of cantilever beams 58 pass through apertures 39 and contact lower surface 38 of substrate 32, thereby attaching clamp 72 to substrate 32. Beams 58 and tabs 61 pull plate 74 vertically downward, thereby pressing interconnection balls 40 against pads 42 of substrate 32. Alternatively, clamp 72 may be placed over electronic device 16 after electronic device 16 is placed on substrate 32.

The various exemplary embodiments described above are illustrative only, and are not intended to limit the scope of the invention to the particular embodiment described.

What is claimed is:

1. A mounting for an electronic device comprising:

an electronic device having a first side, an opposite second side, and an array of electrically conductive contacts at the first side;

a substrate having electrically conductive pads at a first side thereof, and an apparatus on the first side of the substrate, wherein the apparatus includes a body with a plurality of cantilever beams extending therefrom, the electronic device is within the apparatus, and the beams contact the second side of the electronic device and apply a continuous force to the electronic device, which force presses the contacts of the electronic device against the pads of the substrate forming an electrical connection.

2. The mounting of claim 1, wherein the body is a rectangular frame with a central aperture.

3. The mounting of claim 1, wherein the electronic device is selected from the group of a BGA package, a flip chip, and a leadless chip carrier package.

4. The mounting of claim 1, wherein the contacts of the electronic device are selected from a group consisting of a metal coated plastic material, a metal filled plastic material, a metal filled silicone material, a metal filled compliant non-solder material, and a metal filled organic material.

5. The mounting of claim 1, wherein the substrate is a printed circuit board and the electronic device is a semiconductor package or a flip chip.

6. The mounting of claim 1, wherein the apparatus is a one-piece structure.

7. The mounting of claim 1, wherein the free end of the beams includes a ball shape.

8. The mounting of claim 2, wherein the apparatus is a one-piece structure.

9. The mounting of claim 2, wherein the free end of the beams includes a ball shape.

10. The mounting of claim 2, wherein the substrate is a printed circuit board and the electronic device is a semiconductor package or a flip chip.

11. The mounting of claim 3, wherein the apparatus is a one-piece structure.

12. The mounting of claim 3, wherein the free end of the beams includes a ball shape.

13. The mounting of claim 4, wherein the apparatus is a one-piece structure.

14. The mounting of claim 4, wherein the free end of the beams includes a ball shape.

15. The mounting of claim 4, wherein the substrate is a printed circuit board and the electronic device is a semiconductor package or a flip chip.

* * * * *

UNITED STATES PATENT AND TRADEMARK OFFICE
CERTIFICATE OF CORRECTION

PATENT NO.     : 6,441,485 B1  Page 1 of 1
DATED          : August 27, 2002
INVENTOR(S)    : Thomas P. Glenn It is certified that error appears in the above-identified patent and that said Letters Patent is hereby corrected as shown below:

<u>Column 4,</u>
Line 36, delete "54d" and insert -- 54D --.

Signed and Sealed this

Twenty-fifth Day of March, 2003

JAMES E. ROGAN
*Director of the United States Patent and Trademark Office*